United States Patent
Boiteux et al.

(10) Patent No.: US 6,762,127 B2
(45) Date of Patent: Jul. 13, 2004

(54) ETCH PROCESS FOR DIELECTRIC MATERIALS COMPRISING OXIDIZED ORGANO SILANE MATERIALS

(76) Inventors: Yves Pierre Boiteux, 600 Marathon Dr. #69, Campbell, CA (US) 95008; Hui Chen, 900 El Camino Real, Burlingame, CA (US) 94010; Ivano Gregoratto, 538 Shorebird Cir. #22201, Redwood Shores, CA (US) 94064; Chang-Lin Hsieh, 1071 Regency Knoll Dr., San Jose, CA (US) 95129; Hoiman Hung, 1282 Burkette Dr., San Jose, CA (US) 95129; Sum-Yee Betty Tang, 1251 Hazlett Ct., San Jose, CA (US) 95131

(*) Notice: Subject to any disclaimer, the term of this patent is extended or adjusted under 35 U.S.C. 154(b) by 0 days.

(21) Appl. No.: 09/938,432

(22) Filed: Aug. 23, 2001

(65) Prior Publication Data

US 2003/0073321 A1 Apr. 17, 2003

(51) Int. Cl.$^7$ .............................................. H01L 21/304
(52) U.S. Cl. ..................... 438/702; 438/710; 438/723; 438/743; 216/67
(58) Field of Search ................................ 438/702, 723, 438/743, 710; 216/67

(56) References Cited

U.S. PATENT DOCUMENTS

| | | | |
|---|---|---|---|
| 5,362,526 A | 11/1994 | Wang et al. | 427/573 |
| 5,554,570 A | 9/1996 | Maeda et al. | 437/235 |
| 5,635,423 A | 6/1997 | Huang et al. | 437/195 |
| 6,054,379 A | 4/2000 | Yau et al. | 438/623 |
| 6,072,227 A | 6/2000 | Yau et al. | 257/642 |
| 6,162,737 A | 12/2000 | Weimer et al. | 438/738 |
| 6,168,726 B1 | 1/2001 | Li et al. | 216/79 |

(List continued on next page.)

FOREIGN PATENT DOCUMENTS

| | | | |
|---|---|---|---|
| EP | 2000200833 | 7/2000 | H01L/21/768 |
| EP | 1059664 A2 | 12/2000 | H01L/21/311 |
| EP | 2001210627 | 8/2001 | H01L/21/3065 |
| GB | 2358734 A | 8/2001 | |
| JP | HEI 10-189555 | 7/1998 | H01L/21/3065 |
| JP | 2000-200833 A | 7/2000 | H01L/21/768 |
| JP | 2001110901 A * | 4/2001 | H01L/21/316 |
| JP | 2001-210627 A | 8/2001 | H01L/21/3065 |

OTHER PUBLICATIONS

PCT International Search Report, International Application No.: PCT/US 02/26835, Applicant's File Reference No.: 4621/ETCH/DI, International Filing Date: Aug. 22, 2002, Date of Mailing the PCT International Search Report: Feb. 4, 2003, 5 pages.

(List continued on next page.)

Primary Examiner—Felisa Hiteshew
(74) Attorney, Agent, or Firm—Joseph Bach; Albert J. Dalhuisen

(57) ABSTRACT

The present invention provides a novel etching technique for etching a layer of C-doped silicon oxide, such as a partially oxidized organo silane material. This technique, employing $CH_2F_2/Ar$ chemistry at low bias and low to intermediate pressure, provides high etch selectivity to silicon oxide and improved selectivity to organic photoresist. Structures including a layer of partially oxidized organo silane material (1004) deposited on a layer of silicon oxide (1002) were etched according to the novel technique, forming relatively narrow trenches (1010, 1012, 1014, 1016, 1030, 1032, 1034 and 1036) and wider trenches (1020, 1022, 1040 and 1042). The technique is also suitable for forming dual damascene structures (1152, 1154 and 1156). In additional embodiments, manufacturing systems (1410) are provided for fabricating IC structures of the present invention. These systems include a controller (1400) that is adapted for interacting with a plurality of fabricating stations (1420, 1422, 1424, 1426 and 1428).

28 Claims, 8 Drawing Sheets

U.S. PATENT DOCUMENTS

| | | | |
|---|---|---|---|
| 6,174,796 B1 | 1/2001 | Takagi et al. | 438/622 |
| 6,245,665 B1 * | 6/2001 | Yokoyama | 438/623 |
| 6,255,222 B1 | 7/2001 | Xia et al. | 438/710 |
| 6,268,294 B1 | 7/2001 | Jang et al. | 438/706 |
| 6,284,149 B1 | 9/2001 | Li et al. | 216/64 |
| 6,287,979 B1 | 9/2001 | Zhou et al. | 438/723 |
| 6,340,435 B1 * | 1/2002 | Bjorkman et al. | 216/72 |
| 6,342,448 B1 | 1/2002 | Lin et al. | 438/687 |
| 6,350,670 B1 | 2/2002 | Andideh et al. | 438/618 |
| 6,350,700 B1 | 2/2002 | Schinella et al. | 438/723 |
| 6,365,528 B1 | 4/2002 | Sukharev et al. | 438/778 |
| 6,368,979 B1 | 4/2002 | Wang et al. | 438/723 |
| 6,376,365 B1 * | 4/2002 | Tsuji | 438/637 |
| 6,383,951 B1 * | 5/2002 | Li | 438/781 |
| 6,410,437 B1 * | 6/2002 | Flanner et al. | 438/689 |
| 6,472,306 B1 * | 10/2002 | Lee et al. | 438/623 |
| 2001/0055873 A1 | 12/2001 | Watanabe et al. | 438/623 |
| 2002/0061654 A1 | 5/2002 | Kanegae et al. | 438/710 |

OTHER PUBLICATIONS

U.S. patent application Ser. No. 09/533,461, Huang et al., filed Apr. 19, 2000.

Kaanta et al., "Dual Damascene: A ULSI Wiring Technology", VMIC Conference, IEEE, pp. 144–152, Jun. 11–12, 1991.

* cited by examiner

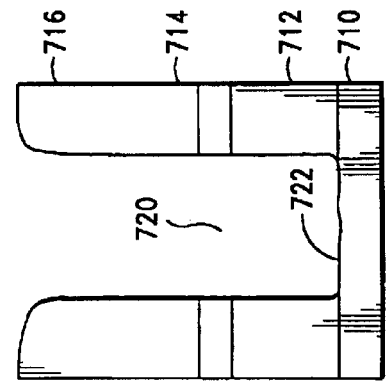
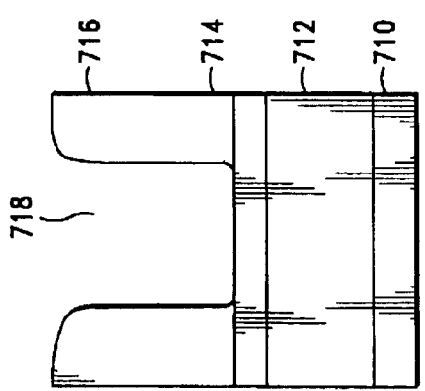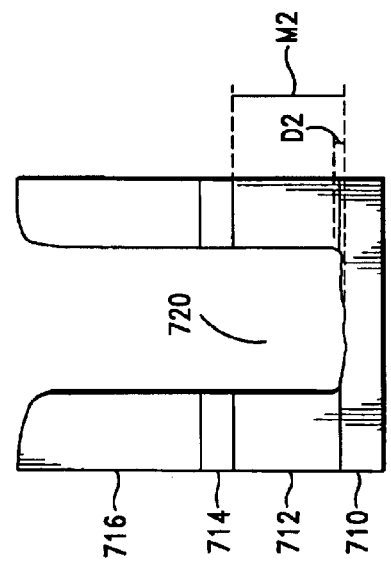
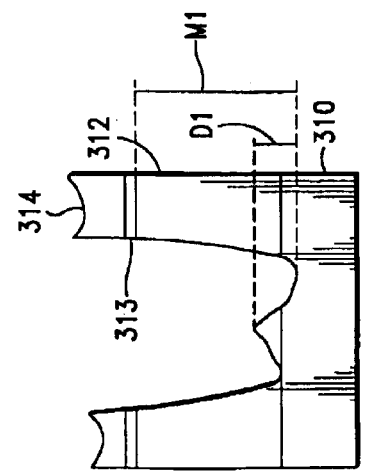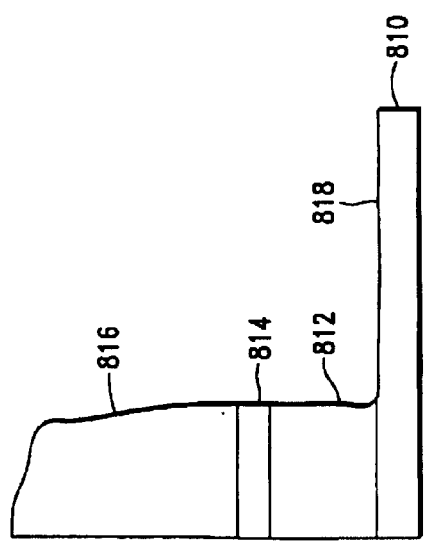

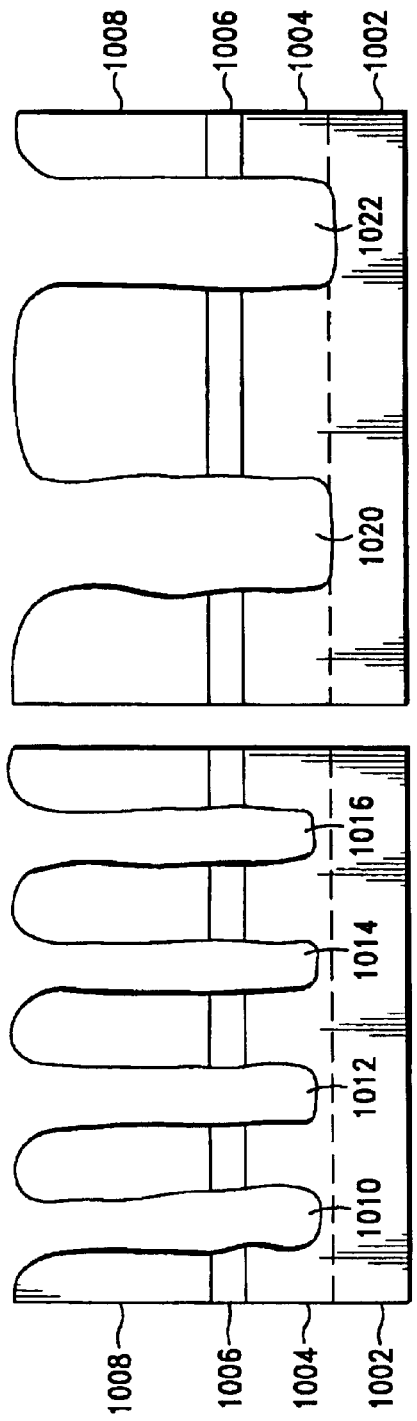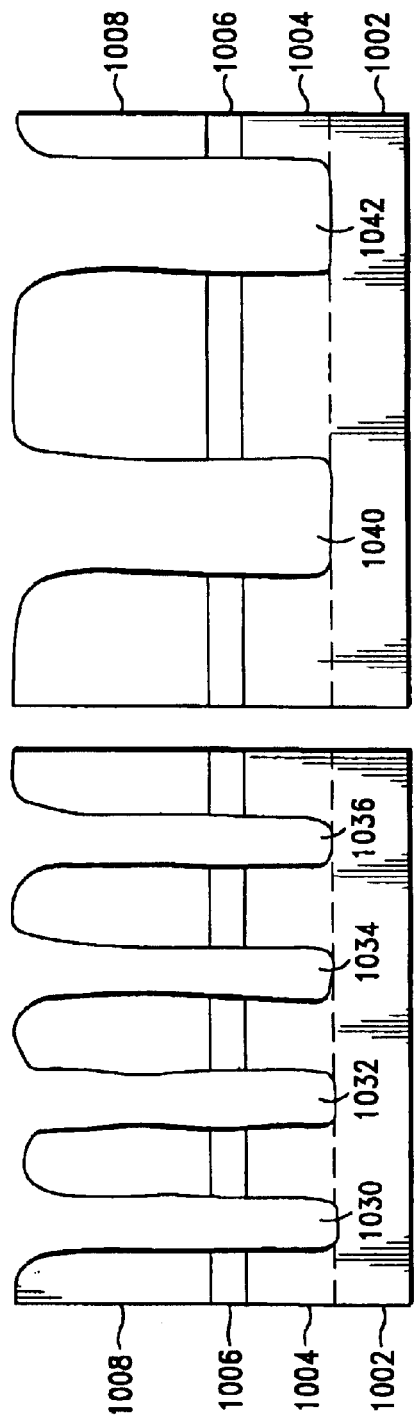

US 6,762,127 B2

ETCH PROCESS FOR DIELECTRIC MATERIALS COMPRISING OXIDIZED ORGANO SILANE MATERIALS

FIELD OF THE INVENTION

The present invention relates to etch processes, materials and devices for plasma etching C-doped silicon oxide, such as oxidized organo silane compounds, to form dielectric materials and in particular to etch processes of these dielectric materials that provide improved etch selectivity to silicon oxide and organic photoresist.

BACKGROUND OF THE INVENTION

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Advances in semiconductor materials and processing techniques have resulted in reducing the overall size of the IC circuit elements while increasing their number on a single body. Additional miniaturization is highly desirable for improved IC performance and cost reduction. Interconnects provide the electrical connections between the various electronic elements of an IC and they form the connections between these elements and the device's external contact elements, such as pins, for connecting the IC to other circuits. Typically, interconnect lines form horizontal connections between electronic circuit elements while conductive via plugs form vertical connections between the electronic circuit elements, resulting in layered connections.

A variety of techniques are employed to create interconnect lines and via plugs. One such technique involves a process generally referred to as dual damascene, which includes forming a trench and an underlying via hole. The trench and the via hole are simultaneously filled with a conductor material, for example a metal, thus simultaneously forming an interconnect line and an underlying via plug. Examples of conventional dual damascene fabrication techniques are disclosed in Kaanta et al., "Dual Damascene: A ULSI Wiring Technology", Jun. 11–12, 1991, VMIC Conference, IEEE, pages 144–152 and in U.S. Pat. No. 5,635,423 to Huang et al., 1997.

An example of a prior art dual damascene technique is illustrated in FIGS. 1A–1C, showing various IC structures. As depicted in FIG. 1A, a dielectric layer 110 is deposited on a semiconductor substrate 112. An etch mask 116, having a via pattern 118, is positioned on dielectric layer 110. A timed anisotropic etch is utilized to etch a hole 120 in layer 110 conforming to the via pattern. Mask 116 is subsequently replaced by mask 122 (FIG. 1B) having a trench pattern 124. A timed anisotropic etch is used to form trench 126 and to simultaneously deepen hole 120 to form via hole 128. This via hole can be etched to expose semiconductor substrate 112. Alternatively, the via hole can be over-etched partly into the substrate. As illustrated in FIG. 1C, the via hole and trench are then filled simultaneously with a suitable metal 130. Metal 130 thus forms a metallized interconnect line 132 and a via plug 134 that is in contact with semiconductor substrate 112. Additionally, a liner or barrier layer may be deposited inside the via hole and the trench prior to deposition of the interconnect metal and the via plug. The surface of layer 110 is planarized to remove excess metal 130 and to define interconnect line 132. Alternatively, metal etch-back can be utilized to define the line.

As described above in connection with etching hole 120 and trench 126, a timed etch procedure is required to form dual damascene structures exemplified by FIGS. 1A–1C. However, it is well known to those of ordinary skill in the art that timed etching techniques are not well suited for reliably forming holes of a predetermined depth. For example, a timed etch of holes across a semiconductor wafer can result in significant depth variations of holes across the wafer, particularly for 200 mm and 300 mm wafers. These depth variations can result in rejected semiconductor products that fail product specifications.

An example of prior art dual damascene that does not utilize a timed etch technique is shown in IC structures illustrated in FIGS. 2A–2C. As depicted in FIG. 2A, a first dielectric layer 210 is deposited on a semiconductor substrate 212. An etch stop layer 216, is deposited on first dielectric layer 210. A second dielectric layer 218 is deposited on etch stop 216, and an etch mask 220 is positioned on dielectric layer 218. Etch mask 220 is patterned (221) for etching a via hole. Second dielectric layer 218 is etched using a first anisotropic etch procedure, to form a hole 222 (FIG. 2A) conforming to the via pattern. This etching procedure is stopped at etch stop layer 216, by using an etch chemistry that is selective to the etch stop layer. Etch mask 220 is removed and another etch mask 224 (see, FIG. 2B) is positioned on second dielectric layer 218 such that it is patterned (226) for forming a trench. A second anisotropic etch procedure is used to etch trench 228 in layer 218. Simultaneously, hole 222 is extended to substrate 212, by etching through etch stop layer 216 and through first dielectric layer 210. In this dual damascene technique the first etch procedure has a greater selectivity to etch stop layer 216 than the second etch procedure. As shown in FIG. 2B, the second etch procedure results in forming trench 228 and via hole 230, that extends to semiconductor substrate 212. Mask 224 is removed, after which trench 228 and via hole 230 are simultaneously filled with a suitable conductive metal 232 (see, FIG. 2C) forming metallized line 234 and via plug 236 that contacts substrate 212. Excess metal 232 is removed from the surface of layer 218 to define line 234.

The techniques described in connection with FIGS. 2A–2C utilize an etch stop layer rather than a timed etch. Dielectric layers, such as layers 210 and 218 shown in FIGS. 2A–2C typically include materials that have a low dielectric constant such as silicon oxide and related silica glasses as well as dielectric polymeric materials. Etch stop layers include silicon nitrides such as $Si_3N_4$. The typical etch stop layer materials have a significantly higher dielectric constant than the materials utilized in the dielectric layers. It is known that the higher dielectric constant of these etch stop materials is disadvantageous because it can result in capacitive coupling between adjacent metal lines, that can lead to cross talk and/or RC (resistance coupling) delay that degrades the overall performance of the IC.

It is known to form dual damascene structures wherein one of the dielectric layers includes a $SiO_x$ material such as $SiO_2$ or a silicon glass while the other dielectric layer comprises a dielectric material having a lower dielectric constant than $SiO_x$. This combination can result in a combined dielectric structure having an improved, i.e. lower, dielectric constant as compared with a structure wherein both layers include $SiO_x$. Dielectric materials having a lower dielectric constant than $SiO_x$ include C-doped silicon oxide materials, such as oxidized organo silane materials that are formed by partial oxidation of an organo silane compound, such that the dielectric material includes a carbon content of at least 1% by atomic weight, as described in U.S. Pat. Nos. 6,072,227 (Yau et al., 2000) and 6,054,379 (Yau et al., 2000)

and U.S. Pat. application Ser. No. 09/553,461 which was filed Apr. 19, 2000, a continuation-in-part of U.S. Pat. No. 6,054,379. Commonly assigned U.S. Pat. Nos. 6,072,227 and 6,054,379, and U.S. Pat. application Ser. No. 09/553,461 are herein incorporated by reference in their entireties.

The oxidized organo silane materials, described in the '227 and '379 patents and the '461 patent application, are formed by incomplete or partial oxidation of organo silane compounds generally including the structure:

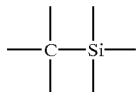

In this structure, —C— is included in an organo group and some C—Si bonds are not broken during oxidation. Preferably —C— is included in an alkyl, such as methyl or ethyl, or an aryl, such as phenyl. Suitable organo groups can also include alkenyl and cyclohexenyl groups and functional derivatives. Preferred organo silane compounds include the structure $SiH_a(CH_3)_b(C_2H_5)_c(C_6H_5)_d$, where a=1 to 3, b=0 to 3, c=0 to 3, d=0 to 3, and a+b+c+d=4, or the structure $Si_2H_e(CH_3)_f(C_2H_5)_g(C_6H_5)_h$, where e=1 to 5, f=0 to 5, g=0 to 5, h=0 to 5, and e+f+g+h=6.

Suitable organo groups include alkyl, alkenyl, cyclohexenyl, and aryl groups and functional derivatives. Examples of suitable organo silicon compounds include but are not limited to:

| | |
|---|---|
| methylsilane | $CH_3$—$SiH_3$ |
| dimethylsilane | $(CH_3)_2$—$SiH_2$ |
| trimethylsilane | $(CH_3)_3$—$SiH$ |
| tetramethylsilane | $(CH_3)_4$—$Si$ |
| dimethylsilanediol | $(CH_3)_2$—$Si(OH)_2$ |
| ethylsilane | $CH_3$—$CH_2$—$SiH_3$ |
| phenylsilane | $C_6H_5$—$SiH_3$ |
| diphenylsilane | $(C_6H_5)_2$—$SiH_2$ |
| diphenylsilanediol | $(C_6H_5)_2$—$Si$—$(OH)_2$ |
| methylphenylsilane | $C_6H_5$—$SiH_2$—$CH_3$ |
| disilanomethane | $SiH_3$—$CH_2$—$SiH_3$ |
| bis(methylsilano)methane | $CH_3$—$SiH_2$—$CH_2$—$SiH_2$—$CH_3$ |
| 1,2-disilanoethane | $SiH_3$—$CH_2$—$CH_2$—$SiH_3$ |
| 1,2-bis(methylsilano)ethane | $CH_3$—$SiH_2$—$CH_2$—$CH_2$—$SiH_2$—$CH_3$ |
| 2,2-disilanopropane | $SiH_3$—$C(CH_3)_2$—$SiH_3$ |
| 1,3,5-trisilano-2,4,6-trimethylene | —($-SiH_2CH_2-$)$_3$— (cyclic) |
| dimethyldimethoxysilane | $(CH_3)_2$—$Si$—$(OCH_3)_2$ |
| diethyldiethoxysilane | $(CH_3CH_2)_2$—$Si$—$(OCH_2CH_3)_2$ |
| dimethyldiethoxysilane | $(CH_3)_2$—$Si$—$(OCH_2CH_3)_2$ |
| diethyldimethoxysilane | $(CH_3CH_2)_2$—$Si$—$(OCH_3)_2$ |
| 1,3-dimethyldisiloxane | $CH_3$—$SiH_2$—$O$—$SiH_2$—$CH_3$ |
| 1,1,3,3-tetramethyldisiloxane | $(CH_3)_2$—$SiH$—$O$—$SiH$—$(CH_3)_2$ |
| hexamethyldisiloxane | $(CH_3)_3$—$Si$—$O$—$Si$—$(CH_3)_3$ |
| 1,3-bis(silanomethylene)disiloxane | $(SiH_3$—$CH_2$—$SiH_2$—$)_2$—$O$ |
| bis(1-methyldisiloxanyl)methane | $(SiH_3$—$SiH_2$—$O$—$SiH_2$—$)_2$—$CH_2$ |
| 2,2-bis(1-methyldisiloxanyl)propane | $(CH_3$—$SiH_2$—$O$—$SiH_2$—$)_2$—$O(CH_3)_2$ |
| 2,4,6,8-tetramethylcyclotetrasiloxane | —($-SiHCH_3$—$O$—)$_4$— (cyclic) |
| octamethylcyclotetrasiloxane | —($-Si(CH_3)_2$—$O$—)$_4$— (cyclic) |
| 2,4,6,8,10-pentamethyl-cyclopentasiloxane | —($-SiHCH_3$—$O$—)$_5$— (cyclic) |
| 1,3,5,7-tetrasilano-2,6-dioxy-4,8-dimethylene | —($SiH_2$—$CH_2$—$SiH_2$—$O$—)$_2$— (cyclic) |
| 2,4,6-trisilanetetrahydropyran | —$SiH_2$—$CH_2$—$SiH_2$—$CH_2$—$SiH_2$—$O$— (cyclic) |
| 2,5-disilanetetrahydrofuran and fluorinated derivatives thereof. | —$SiH_2$—$CH_2$—$CH_2$—$SiH_2$—$O$— (cyclic) |

Preferred organo silane compounds include but are not limited to: methylsilane; dimethylsilane; trimethylsilane; tetramethylsilane; dimethylsilanediol; diphenylsilane; diphenylsilanediol; methylphenylsilane; bis(methylsilano)methane; 1,2-bis(methylsilano)ethane; 1,3,5-trisilano-2,4,6-trimethylene; dimethyldimethoxysilane; diethyldiethoxysilane; dimethyldiethoxysilane; diethyldimethoxysilane; hexamethyldisiloxane; octamethylcyclotetrasiloxane; and fluorinated derivatives thereof. The most preferred organo silane compounds include methyl silane and trimethyl silane.

The organo silane compounds are oxidized during deposition by reaction with oxygen ($O_2$) or oxygen containing compounds such as nitrous oxide ($N_2O$) and hydrogen peroxide ($H_2O_2$), such that the carbon content of the deposited film is from 1% to 50% by atomic weight, preferably about 20%. The oxidized organo silane layer has a dielectric constant of about 3.0. Carbon, including some organo functional groups, remaining in the oxidized organo layer contributes to low dielectric constants and good barrier properties providing a barrier that inhibits for example diffusion of moisture or metallic components. These oxidized organo silane materials exhibit good adhesion properties to silicon oxide and silicate glass as well as typical dielectric materials employed in IC structures. The above described oxidized organo silanes include BLACK DIAMOND™ technology, available from Applied Materials, Inc. located in Santa Clara, Calif.

Plasma conditions for depositing a layer of the oxidized organo silane material having a carbon content of at least 1% by atomic weight, include a high frequency RF power density from about at least 0.16 W/cm² and a sufficient amount of organo silane compound with respect to the oxidizing gas to provide a layer with carbon content of at least 1% by atomic weight. When oxidizing organo silane materials with $N_2O$, a preferred high frequency RF power density ranges from about 0.16 W/cm² to about 0.48 W/cm². These conditions are particularly suitable for oxidizing $CH_3$—$SiH_3$ with $N_2O$. Oxidation of organo silane materials such as $(CH_3)_3$—$SiH$ with $O_2$ is preferably performed at a high frequency RF power density of at least 0.3 W/cm², preferably ranging from about 0.9 W/cm² to about 3.2 W/cm². Suitable reactors for depositing this material include parallel plate reactors such as those described in the '379 and '227 patents. As shown in the '227 and '379 patents and in the '461 application, the oxidized organo silane materials including at least 1% of carbon can be utilized in multi-layered structures such as are used, for example, in fabricating dual damascene integrated circuit structures.

A conventional etch chemistry for silicon oxide was used to etch a trench through a layer of partially oxidized organo silane material that was deposited on a layer of conventional $SiO_2$ as illustrated in FIGS. 3A, 3B and 5. As depicted in FIG. 3A, a layer 310 of silicon dioxide was deposited on a semiconductor substrate (not shown) by PECVD (plasma enhanced chemical vapor deposition) using TEOS (tetraorthosilicate) and ozone reactants. Methods and technologies for depositing silicon dioxide such as layer 310 are well known to those of ordinary skill in the art, see for example U.S. Pat. No. 5,362,526 (Wang et al., 1994). A layer 312 of partially oxidized $CH_3SiH_3$ was deposited on layer 310, using $N_2O$ oxidizing gas in argon inert carrier gas, and employing PECVD layer deposition technology as described in the '227 and '379 patents. An ARC (antireflective coating) 313 including SiON was then deposited on layer 312. Subsequently, a layer 314 of deep U.V. organic photoresist was deposited on layer 313 and a trench mask 316 was developed in resist layer 314.

A trench 318 was anisotropically etched in ARC layer 313 and in oxidized organo silane layer 312, using etch mask 316, see FIG. 3B. Trench 318 etching was performed in an IPS (inductive plasma source) etch reactor available from Applied Materials, Inc. of Santa Clara, Calif. In this type of reactor a HDP (high density plasma) is generated wherein the plasma is independent from the biasing of the pedestal supporting the semiconductor wafer containing structures such as the structure illustrated in FIG. 3A.

The IPS etch reactor utilized in etching trench 318, shown in FIG. 3B, is schematically illustrated in FIG. 4. A semiconductor wafer 440 is supported on a cathode pedestal 442, that is supplied with RF (radio frequency) power from a first RF power supply 444. A silicon ring 446 surrounds the pedestal 442 and is controllaby heated by an array of heater lamps 448. A grounded silicon wall 450 surrounds the plasma processing area. A silicon roof 452 overlies the plasma processing area, and lamps 454. Water cooling channels 456 control the roof temperature. The temperature-controlled silicon ring 486, and the silicon roof 452, can be used to scavenge fluorine from the fluorocarbon or other fluorine-based plasma. Processing gas is supplied from one or more gas feeds 454 through a bank of mass flow controllers 456. Alternatively, a top gas fed may be formed as a small showerhead in the center of the silicon roof 452. An unillustrated vacuum pumping system connected to a pumping channel 458 around the lower portion of the chamber maintains the interior of the chamber at a preselected pressure. A system controller 460 controls the operation of the reactor and its auxiliary equipment.

In the used configuration, the silicon roof 452 is grounded, see FIG. 4. The semiconductor resistivity and thickness of roof 452 are chosen to pass generally axial RF magnetic fields produced by an inner inductive coil stack 466 and an outer inductive coil stack 468 powered by respective RF power supplies 470 and 472. Alternatively, a single RF power supply may be used in conjunction with a selectable power splitter. Other coil configurations are possible, for example, as in the TCP reactor having a flat, spiral inductive coil overlying the roof 452.

The system controller 460 controls the mass flow controllers 456, the heater lamps 448, 454, the supply of chilled water to the cooling channels 456, the throttle valve to the vacuum pumps, and the power supplies 444, 470 and 472. All these regulated functions control the etching chemistry in conformance to the processing conditions to be described in connection with FIGS. 3A, 3B and 5, and in Table A. The process recipe can be stored in the controller 460 in magnetic, optical, or semiconductor memory, as is well known in the art, and the controller 460 reads the recipe from a recording medium inserted into it. Recipes can be provided on magnetic media such as floppy disks or optical media such as CDROMs, that can then be read into controller 460.

Inductively coupled plasma reactors, such as shown in FIG. 4, are adapted to provide different amounts of power to inductive coils 466 and 468, and to capacitive pedestal 442. The inductive power creates a plasma source region located in large part remotely from the wafer 440 while the capacitive power controls the plasma sheath adjacent to the wafer 440 and thus determines the DC bias across the sheath at the wafer 440. The source power can be raised to increase the etching rate and control the number and type of excited radicals while the bias power can be varied to cause ions to be accelerated across the plasma sheath with either high or low energy and to then strike the wafer 440 with the selected energy.

The etch parameters for etching trench 318 (FIG. 3B) using $C_4F_8$/Ar chemistry are shown in Table A. These parameters are typical of conventional etch parameters for IPS etching of silicon oxide containing dielectric layers such as are employed in IC structures.

TABLE A

| | |
|---|---|
| Ratio of $C_4F_8$ Flow/Ar Flow | about 1/7 |
| Total Source Power (W) | about 1300—1400 |
| Bias Power (W) | about 1000 |
| Pressure (mT) | 7 |
| Etch Rate of layer 312 (Å/min) | 4000 |
| Organic photoresist selectivity | 2.5:1 |

A typical example of a trench etch of the structure shown in FIG. 3A, using the etch reactor exemplified in FIG. 4 and the etch parameters shown in Table A, is depicted in the cross sectional view of FIG. 3B. As shown in FIG. 3B, etch front 320 does not exhibit high $SiO_2$ etch selectivity under these etching conditions since the trench etch progressed partly into silicon dioxide layer 310 without removing all of the oxidized organo silane material from the bottom of trench 318. It is therefore difficult to achieve an effective etch stop with $SiO_2$, when etching a dielectric material including at least 1% of carbon that is formed by a partially oxidized organo silane material, and using conventional etch chemistry such as $C_4F_8$ g/Ar chemistry according to the parameters of Table A. It has also been observed that micro trenches are likely to be formed at the interface between the oxidized organo silane layer and the underlying silicon oxide layer when a trench for depositing an interconnect line is etched through the oxidized organo silane layer employing a conventional etch recipe for etching silicon oxide.

FIG. 5 illustrates another example of using $C_4F_8$/Ar chemistry for etching a structure including $SiO_2$ layer 510, oxidized organo silane material layer 512 and photoresist layer 514. Layers 510, 512, 513 and 514 of FIG. 5 correspond to layers 310, 312, 313 and 314 respectively illustrated in FIG. 3A. The etch parameters for etching this structure are shown in Table A. Returning to FIG. 5, etch front 520 shows that $SiO_2$ does not provide an effective etch stop for this etching process of a dielectric material including at least 1% of carbon that is formed by a partially oxidized organo silane material.

A substantially flat etch front is highly desirable when etching for example trenches and via holes in dielectric layers for fabricating IC structures. The degree of flatness of an etch front of a typical cross section can be expressed as an EFF (etch front flatness) that can be calculated for an etch profile such that EFF equals the following ratio: delta etch front/maximum etch depth. "Delta etch front" denotes the height difference between the highest and lowest points of the edge front, while "maximum etch depth" constitutes the etch depth from the top of the dielectric layer to the bottom of lowest point of the edge front. The "delta etch front" and "maximum etch depth" are both expressed in the same units. For example, the etch profile of trench 318 (FIG. 3B) as shown in FIG. 6 exhibits a delta etch front D1=87 nm and a maximum etch depth M1=382 nm, resulting in an EFF of 0.23, wherein the maximum etch depth is measured from the top of layer 312 to the bottom of the lowest point of edge front 320. Measurements D1 and M1 were conducted on an SEM (scanning electron micrograph) (not shown) of FIG. 6. Trench 318 was fabricated at a width of about 500 nm and a depth of about 330 nm As shown in FIGS. 3A and 3B, the resist layer is partly stripped following trench etching.

Silicon nitrides are known to have high selectivity to etch chemistries that are used for etching silicon oxides, such as the $C_4F_8$/Ar etch chemistry shown in Table A. It would thus be possible to use an etch chemistry such as $C_4F_8$/Ar for etching a top layer of a partially oxidized organo silane when a nitride etch stop is deposited between this top layer and an underlying layer of silicon oxide. However, the use of a nitride etch stop results in less favorable dielectric properties as described in connection with FIGS. 2A–2C, thus partly negating the advantages of the low dielectric constant of the partially oxidized organo silane material.

Accordingly, the need exists for etch chemistries for C-doped silicon oxide such as partially oxidized organo silane materials including at least 1% of carbon, that provide improved etch selectivity to silicon oxide.

SUMMARY OF THE INVENTION

The present invention provides novel methods and techniques for etching C-doped silicon oxide, such as partially oxidized organo silane materials, that overcome the prior art etching problems described above.

In one embodiment of the present invention a novel etch technique is employed for etching a layer of C-doped silicon oxide, such as a partially oxidized organo silane material including at least 1% of carbon by atomic weight. This technique utilizing $CH_2F_2$/Ar chemistry at low bias and low pressure.

In another embodiment of the present invention a layer of partially oxidized organo silane material including at least 1% of carbon by atomic weight, was deposited on a layer of silicon oxide. An etch pattern was anisotropically etched through the layer of partially oxidized organo silane material, employing the novel etch technique. High $SiO_2$ etch selectivity and a substantially flat etch front were obtained, having an etch front flatness no greater than 0.1. Also, the novel etch technique resulted in improved selectivity to organic photoresist.

In an additional embodiment of the present invention, a layer of C-doped silicon oxide is deposited on a layer of silicon oxide that is formed on a substrate. A via pattern is etched sequentially through the layers of C-doped silicon oxide and silicon oxide. Subsequently, the novel etch procedure is employed for etching a trench through the layer of C-doped silicon oxide overlaying the hole formed by etching the via pattern.

In another embodiment of the present invention a layer of silicon nitride was deposited on a semiconductor substrate. This was followed by the deposition of layers of adhesion promoter, silicon oxide, adhesion promoter, oxidized organo silane material and photoresist. A via etch pattern was developed in the resist. The via etch pattern was then anisotropically etched to expose the silicon nitride layer. A trench etch pattern was developed overlaying the hole. Employing the novel etch technique, the trench pattern was anisotropically etched through the oxidized organo silane layer and the underlying layer of adhesion promoter, thus forming a trench on an underlying via hole. The bottom of the trench exposed the silicon oxide layer and it was observed that a substantially flat etch front was obtained at the bottom of the etch. The novel technique is not selective to silicon nitride. As a result, trench etching opens the silicon nitride layer at the bottom of the via hole. However, this technique utilizes a bias that is too low to cause copper sputter of a copper line that is exposed at the bottom of the via hole. The trench and via hole can simultaneously be filled with a conductive material to form a dual damascene structure. Alternatively, the via and trench can be lined with a liner such as a barrier liner or adhesive layer prior to simultaneously filling the via hole and trench with a conductive material. Additionally, silicon nitride exposed at the bottom of the hole can be protected from the trench etching process by partly filling the bottom of the via hole with an organic ARC (antireflective coating) material. It is also contemplated to protect the silicon nitride at the bottom of the hole by providing photoresist material in the hole, prior to etching the trench.

In additional embodiments novel IC structures were formed including a metallizing layer of partially oxidized organo silane material, deposited on a layer of silicon oxide. One or more cavities were etched in the metallization layer utilizing the novel etch technique, such that a substantially flat etch front was obtained.

In a further embodiment of the present invention, a manufacturing system is provided for forming fabricated structures, such as the IC structures of the present invention. This system includes a controller, such as a computer, that is adapted for interacting with a plurality of fabrication stations. Each of these fabrication stations performs a processing step that is utilized to fabricate the IC structures. Operative links provide connections between the controller and the manufacturing stations. A data structure, such as a computer program, causes the controller to control the processing steps which are performed at the fabrication stations.

BRIEF DESCRIPTION OF THE DRAWINGS

FIGS. 3A and 3B are cross sectional views illustrating a conventional etch process for etching an IC structure having a layer of partially oxidized organo silane material, wherein FIG. 3B represents a graphical representation of an SEM.

FIG. 6 is a cross sectional view showing etch front flatness parameters of the graphical representation illustrated in FIG. 5.

FIGS. 7A and 7B are cross sectional views illustrating an embodiment of the present invention at sequential stages, wherein FIG. 7B represents a graphical representation of an SEM.

FIG. 8 is a cross sectional view showing a graphical representation of an SEM further illustrating the embodiment of the present invention shown in FIGS. 7A and 7B.

FIG. 9 is a cross sectional view showing etch front flatness parameters of the graphical representation illustrated in FIG. 7B.

FIGS. 10A–10D are cross sectional views showing graphical representations of SEMs illustrating an embodiment of the present invention.

FIGS. 11A–11C are cross sectional views illustrating an embodiment of the present invention at sequential stages, wherein FIGS. 11A and 11B represent graphical representations of SEMs.

DETAILED DESCRIPTION OF THE INVENTION

While describing the invention and its embodiments, certain terminology will be utilized for the sake of clarity. It is intended that such terminology include the recited embodiments as well as all equivalents.

In one embodiment of the present invention $CH_2F_2/Ar$ chemistry is employed using selective etch conditions to etch partially oxidized organo silane materials including at least 1% of carbon by atomic weight, such that high etch selectivity to $SiO_x$ is obtained. The present techniques are suitable for forming fabricated structures, such as IC (integrated circuit) structures shown in FIGS. 7B and 8. The expression "integrated circuit structure" as defined herein, includes completely formed integrated circuits and partially formed integrated circuits.

Figure 3A:
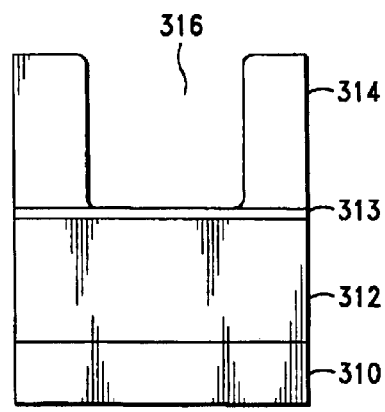

As shown in FIG. 7A, a dielectric layer 710 of $SiO_2$ was deposited on a semiconductor substrate (not shown). The expression "semiconductor substrate" as defined herein, includes structures and devices comprising typical integrated circuit elements, components, interconnects and semiconductor materials. A layer 712 of partially oxidized organo silane $CH_3SiH_3$ material was deposited on layer 710. The partially oxidized organo silane material of layer 712 is formed by partial oxidation of $CH_3SiH_3$, using sufficient $N_2O$ to form a dielectric material that includes a carbon content of at least 1% by atomic weight, similar to layer 312 shown in FIGS. 3A and 3B. Subsequently, a layer 714 of conventional DARC (dielectric antireflective coating) SiON was deposited on layer 712. This was followed by the deposition of a layer 716 of conventional deep U.V. organic photoresist. Layers 710, 712 and 716 of FIG. 7A are similar to layers 310, 312 and 314 respectively, as described in connection with FIGS. 3A and 3B. A trench pattern 718, forming an aperture, was provided in the photoresist.

Figure 4:
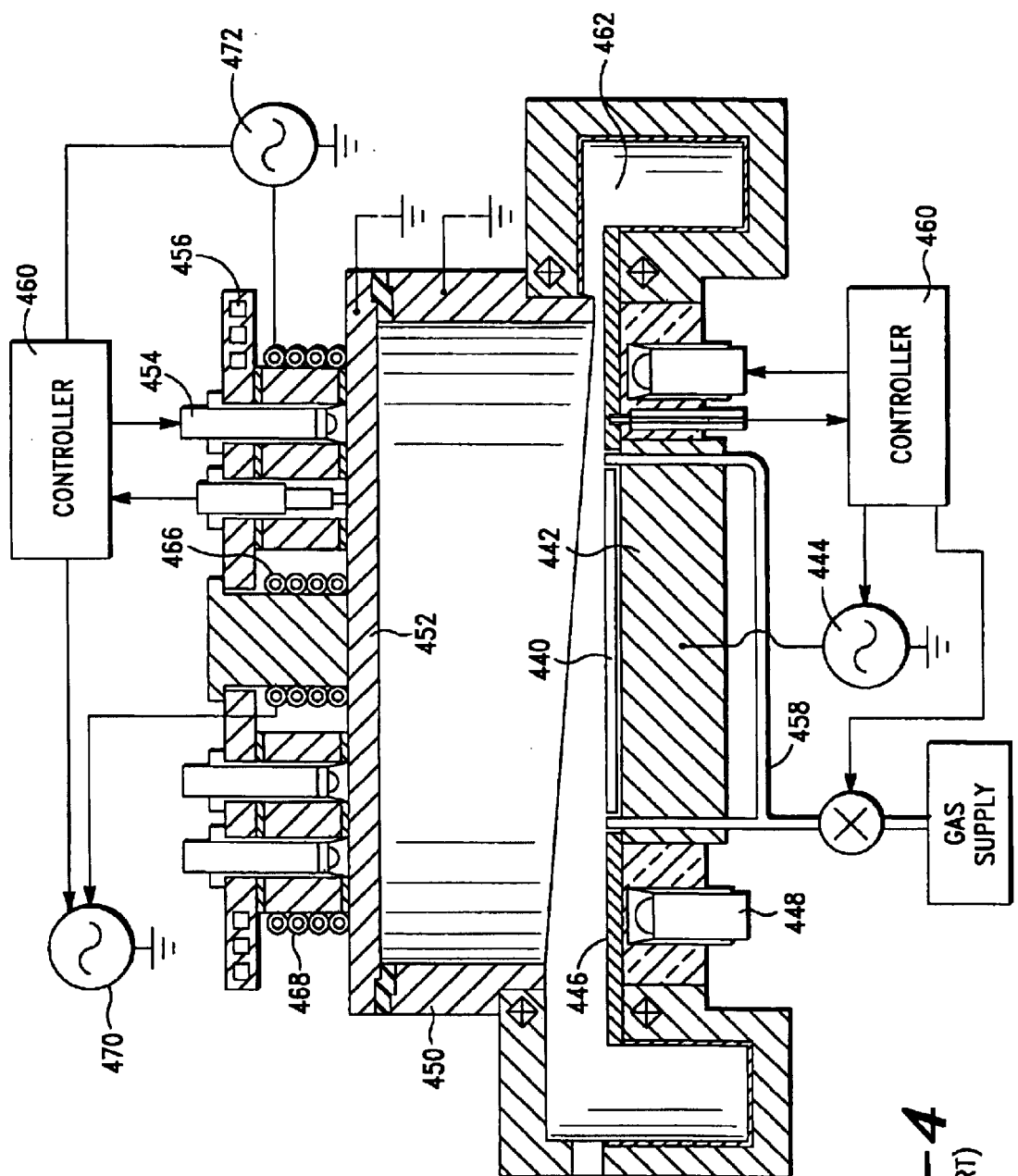
FIG. 4 is a schematic view of a conventional inductively coupled high density plasma etch reactor.

A novel etch method for etching the partially oxidized organo silane compounds was then employed to anisotropically etch the trench pattern through layers 714 and 712, resulting in trench 720, shown in FIG. 7B, exposing $SiO_2$ layer 710 at the bottom of trench 720. The novel method uses $CH_2F_2/Ar$ chemistry, employing an IPS etch reactor such as shown in FIG. 4, and using the etch parameters provided in Table B.

TABLE B

| | |
|---|---|
| Ratio of $CH_2F_2$ Flow/Ar Flow | about 1/10 to about 1/15 |
| Total Source Power (W) | 500—800 |
| Bias Power (W) | 500 |
| Pressure (mT) | 60 |
| Etch Rate of layer 712 (kÅ/min) | 4 |
| Organic photoresist selectivity | 5:1 |

As shown in FIG. 7B, the novel etch method resulted in a substantially flat etch front 722 at the $SiO_2$ layer indicating a surprisingly effective etch selectivity for $SiO_2$. This etch selectivity is surprising because the partially oxidized $CH_3SiH_3$ layer and the $SiO_2$ layer each include silicon-to-oxygen bonds. Advantageously, the novel etch method results in a higher etch selectivity to organic photoresist than is achieved with the conventional etch technique shown in Table A.

FIG. 8 illustrates another example of the novel etch method of a structure including $SiO_2$ layer 810, oxidized $CH_3SiH_3$ layer 812, DARC layer 814 and photoresist layer 816. Layers 810, 812, 184 and 816 correspond to layers 710, 712, 714 and 716 respectively of FIGS. 7A and 7B. Subsequently, an etch mask (not shown), forming an aperture, was formed in the resist. The structure was anisotropically etched using the etch parameters shown in Table B. The resulting substantially flat etch front 818, depicted in FIG. 8, demonstrates the high $SiO_2$ etch selectivity that is obtained with the novel etching technique for oxidized organo silane material including a carbon content of at least 1% by atomic weight.

The EFF of the structure illustrated in FIG. 7B was determined as shown in FIG. 9, using the methodology described in connection with FIG. 6, and utilizing an SEM (not shown) of FIG. 9. According to this methodology, the EFF of trench 720 equals D2/M2=0.08.

Figure 3B:
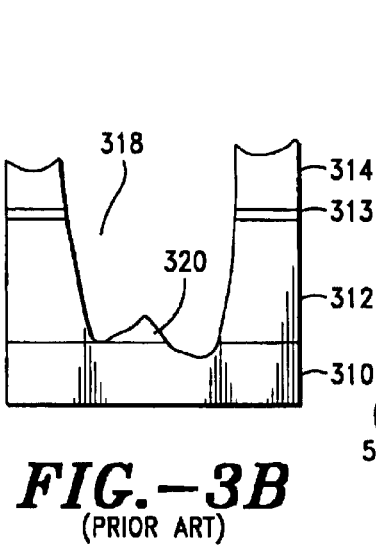
Figure 5:
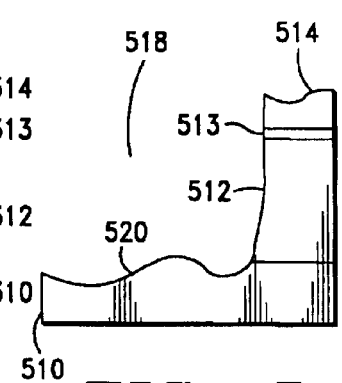
FIG. 5 is a cross sectional view showing a graphical representation of an SEM illustrating a conventional etch process for etching an IC structure having a layer of partially oxidized organo silane material.

In structures wherein the partially oxidized organo silane material forms a fairly thin layer, such as an adhesive layer typically having a thickness of about 500 Å, a fairly flat etch front can result even if the etching technique does not provide high etch selectivity to $SiO_2$, such as the conventional techniques described in connection with FIG. 3B. However, in structures wherein the partially oxidized organo silane layer is relatively thick, such as an metallization layer having a thickness of at least about 300 nm, high etch selectivity to $SiO_2$ is necessary in order to form a substantially flat etch front at the bottom of the via hole or trench that is etched through the partially oxidized organo silane layer to expose the $SiO_2$ layer.

Exemplary structures that are obtained by an embodiment of the present invention are shown in FIGS. 7B and 8 including: (1) a layer of C-doped silicon oxide, for example comprising partially oxidized organo silane material including at least 1% of carbon by atomic weight, having a thickness of at least about 300 nm, that is deposited on a layer of silicon oxide, (2) a cavity such as a via hole or trench that is etched through the C-doped silicon oxide layer such that the silicon oxide is exposed at the bottom of the cavity and (3) wherein the cavity has a substantially flat etch front, for example having an etch front flatness of about 0.1 or less.

The photoresist and DARC layers can be removed from the structures shown in FIGS. 7B and 9, to allow additional fabricating steps such as metal fill of the trenches.

In another embodiment of the present invention, illustrated in FIGS. 10A–10D, a 200 mm semiconductor wafer was prepared. This wafer included $SiO_2$ layer 1002, partially oxidized $CH_3SiH_3$ material layer 1004, DARC layer 1006 and photoresist layer 1008 similar to the corresponding layers described in connection with FIGS. 7A and 7B. Relativily narrow trenches having a design width of about 230 nm and wider trenches having a width of about 460 nm were etched in oxidized $CH_3SiH_3$ layer 1004 and in DARC layer 1006, having a combined thickness of about 330 nm, using the etch parameters shown in Table C.

TABLE C

| | |
|---|---|
| Ratio $CH_2F_2$ Flow/Ar Flow | 1/10 |
| Total Source Power (W) | 800 |
| Bias Power (W) | 300 |
| Pressure (mT) | 60 |

Trenches 1010, 1012, 1014, 1016 (FIG. 10A) and trenches 1020 and 1022 (FIG. 10B) were anisotropically etched at the top edge of the wafer. Trenches 1030, 1032, 1034, 1036

(FIG. 10C) and trenches 1040, 1042 (FIG. 10D) resulted from anisotropically etching at the center of the wafer. FIGS. 10A–10D show that a substantially flat etch front is obtained where trenches expose the $SiO_2$ layer. Thus showing high selectivity of the novel etch method to $SiO_2$ layer 1002. FIG. 10A shows that trenches 1010, 1012, 1014 and 1016 are not etched to the interface with $SiO_2$ layer 1002. A layer of about 600 Å thickness remains between the bottom of these trenches and the $SiO_2$ layer, while trenches 1030, 1032, 1034 and 1036 (FIG. 10C) are open to the $SiO_2$ layer, indicating that trench etching was not completely uniform for etching 230 nm trenches across this wafer using the novel etch parameters. However, uniform etch depth was obtained when trenches, having a width of 460 nm were formed by this etch technique, as illustrated in FIGS. 10B and 10D.

The photoresist and DARC layers can be removed from the structures shown in FIGS. 10A–10D, to allow additional fabricating steps such as metal fill of the trenches. Alternatively, via holes and trenches such as those formed in structures illustrated in FIGS. 10A–10D, can be formed without the use of an antireflective coating such as DARC layer 1006.

Additional experiments (not illustrated) were conducted wherein trenches were anisotropically etched according to embodiments of the present invention as described in connection with FIGS. 10A–10D. The etch results were compared with those obtained at an etch pressure of 30 mT. These experiments showed that etch profile bowing and/or undercut is slightly more noticeable at 30 mT than at 60 mT, while center-to-edge uniformity across the wafer is very similar at these two pressures.

Exemplary structures that are obtained by an embodiment of the present invention are shown in FIGS. 10A–10D including: (1) a layer of C-doped silicon oxide, for example comprising partially oxidized organo silane material including at least 1% of carbon by atomic weight, having a thickness of at least about 300 nm, that is deposited on a layer of silicon oxide, (2) a cavity such as a via hole or a trench that is etched through the C-doped silicon oxide layer such that the silicon oxide is exposed at the bottom of the cavity and (3) wherein the cavity has a substantially flat etch front, for example having an etch front flatness of about 0.1 or less.

In another series of experiments, trenches were anisotropically etched (not shown) as described in connection with FIGS. 10A–10D, and using the novel etch method shown in the parameters of Table C at outer source powers of 600 W, 700 W and 800 W. The results showed a higher etch rate of $SiO_2$ at the $SiO_2$ interface when using 800 W outer source power, indicating that a slightly lower $SiO_2$ selectivity was obtained when using an outer source power of 800 W.

Figure 11A:
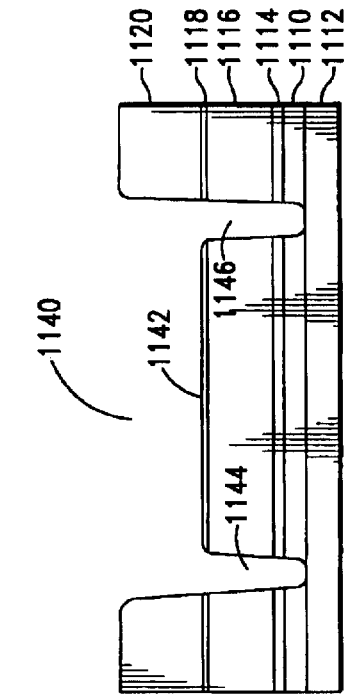
Figure 11B:
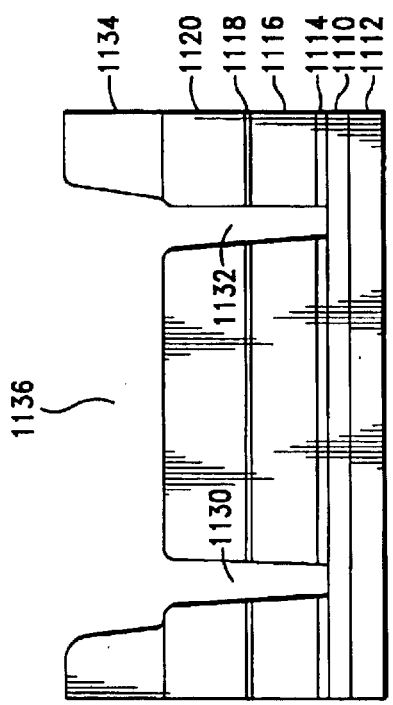
Figure 11C:
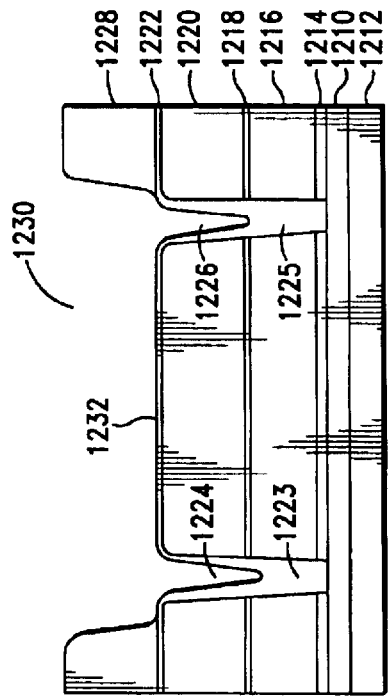

As schematically illustrated in FIGS. 11A–11C, the novel etch method was employed for fabricating dual damascene IC structures. A silicon nitride etch stop layer 1110 was deposited on a semiconductor substrate 1112, see FIG. 11A. A silicon oxide adhesive layer 1114, also known as an adhesion promoter layer, was deposited on etch stop layer 1110. Adhesive layer 1114 can be formed using well known TEOS technology. A layer 1116 of $SiO_2$, similar to layer 710 (FIGS. 7A and 7B), was then deposited on adhesive layer 1114. Subsequently, an adhesive layer 1118 similar to layer 1114 was deposited on $SiO_2$ layer 1116. This was then followed by the deposition of layer 1120 of partially oxidized $CH_3SiH_3$ including at least 1% of carbon, wherein layer 1120, shown in FIG. 11A, is similar to layer 712 depicted on FIGS. 7A and 7B. Next, holes 1130 and 1132 (FIG. 11A) were anisotropically etched successively through layers 1120, 1118, 1116 and 1114, using conventional etch methods and techniques. A conventional deep U.V. photoresist layer 1134 was applied to the structure containing the holes. A trench etch mask 1136 was prepared in photoresist 1134, overlaying holes 1130 and 1132, see FIG. 11A. A trench 1140, shown in FIG. 11B, was obtained by anisotropically etching through oxidized $CH_3SiH_3$ layer 1120, employing the novel etch parameters shown in Table D and utilizing an IPS etch reactor such as described in connection with FIG. 4.

TABLE D

| Ratio of $CH_2F_2$ Flow/Ar Flow | 1/10 |
|---|---|
| Total Source Power (W) | 1000 |
| Bias Power (W) | 300 |
| Pressure (mT) | 60 |

Returning to FIG. 11B, high $SiO_2$ etch selectivity and a substantially flat etch front 1142 were obtained at silicon oxide layer 1118. It was observed that etching trench 1140 caused via holes 1144 and 1146 to be etched through nitride layer 1110 since the novel etch method exhibits poor etch selectivity to nitride. Commonly, vias such as vias 1144 and 1146 are formed on metal lines (not shown), such as Cu, embedded in substrate 1112. In conventional etching methods, opening the via to copper can result in Cu sputtering, resulting in Cu deposits on the walls of the via. However, the present novel technique utilizes a bias power (see Table D) that is too low to cause substantial Cu sputtering.

Figure 1A:
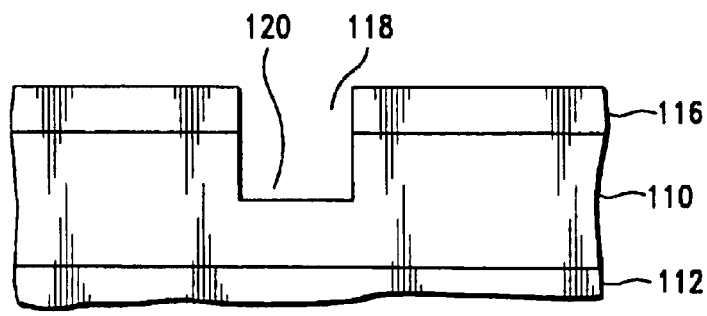
FIGS. 1A–1C are schematic cross-sectional side views illustrating prior art IC structures at sequential stages.
Figure 1B:
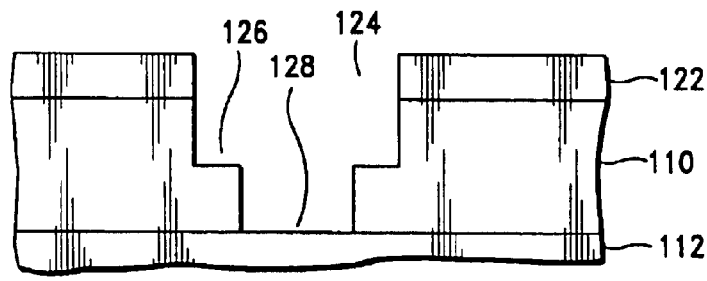
Figure 1C:
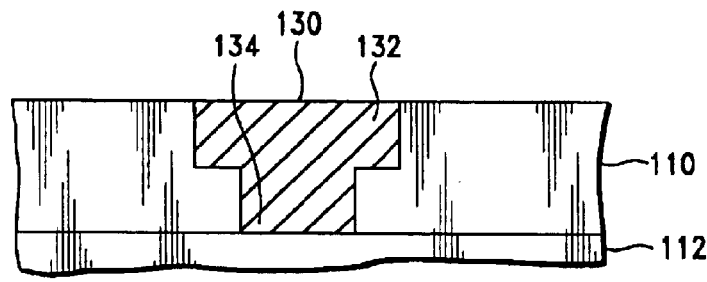
Figure 2A:
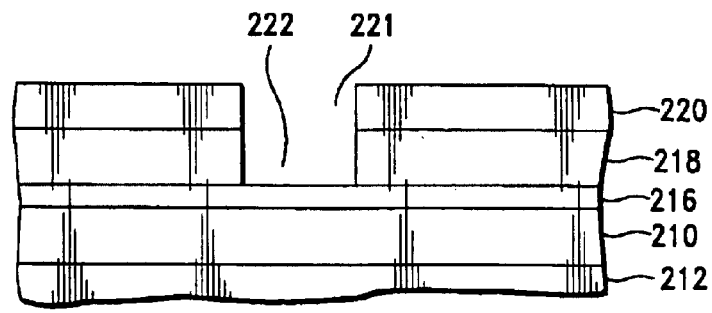
FIGS. 2A–2C are schematic cross-sectional side views illustrating prior art IC structures at sequential stages.
Figure 2B:
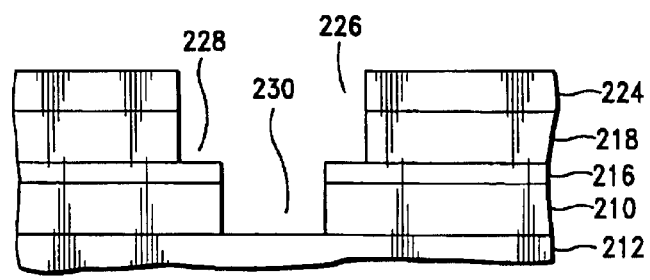
Figure 2C:
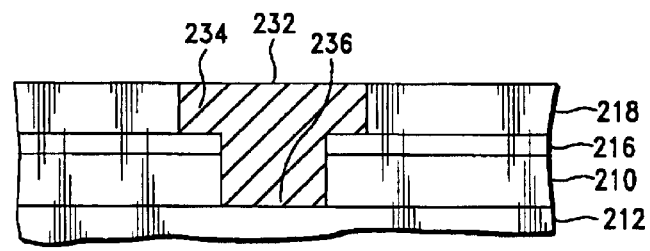

An exemplary structure that is obtained by an embodiment of the present invention is shown in FIG. 1B including: (1) a layer of C-doped silicon oxide, for example comprising partially oxidized organo silane material including at least 1% of carbon by atomic weight, and having a thickness of at least about 300 nm, that is deposited on a layer of silicon oxide, (2) a cavity such as a hole or trench that is etched through the C-doped silicon oxide layer such that the silicon oxide is exposed at the bottom of the cavity and (3) wherein the cavity has a substantially flat etch front, for example having an etch front flatness of about 0.1 or less.

As illustrated in FIG. 11C, the via holes and trench depicted in FIG. 11B can be filled simultaneously with a conductive material, such as a metal 1150, after removal of resist layer 1134. The resulting structure forms a dual damascene structure comprising via plugs 1152, 1154 and interconnect line 1156, illustrated in FIG. 11C. Excess conductive material 1152 is removed from the surface of layer 1120, for example using CMP (chemical mechanical polishing), or using metal etch back, to define line 1156. The expression "dual damascene" as defined herein, includes an interconnect line and one or more underlying via plugs that are formed simultaneously, wherein the interconnect line is formed in a trench. Layers that are adapted for forming a line therein are referred to as metallization layers.

Additional embodiments (not shown) of the present invention include deposing a liner inside the via holes and trench of structures such as shown in FIG. 11B. The lined via holes and trenches are then simultaneously filled with a conductive material to form dual damascene structures. Suitable liner materials include adhesion promoters and diffusion barrier materials. For example suitable liner materials for Cu or Cu alloy containing dual damascene structures include CVD (chemical vapor deposition) or PVD (physical vapor deposition) TiN, WN, Ta and TaN.

Examples of suitable liner materials for Al, Al alloy, W, or W alloy containing dual damascene structures include PVD Ti/TiN.

Figure 12:
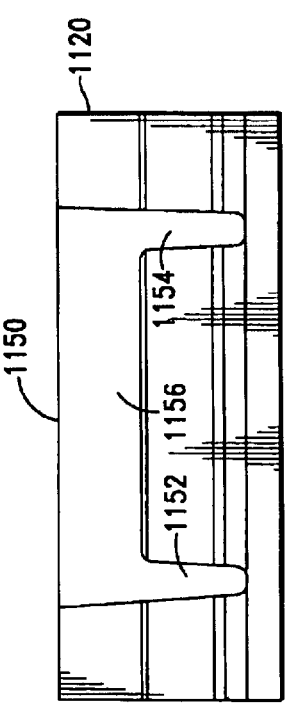
FIG. 12 is a schematic cross sectional view illustrating an embodiment of the present invention.

It is also contemplated to protect the nitride etch stop layer while etching the trench, by means of a conventional ARC layer, as illustrated in FIG. 12. Layers 1210, 1212, 1214, 1216, 1218 and 1220 shown in FIG. 12 are similar to layers 1110, 1112, 1114, 1116, 1118 and 1120 respectively, as depicted in FIG. 11A. Following preparation of the holes through the dielectric layers, as described in connection with FIG. 11A, a conventional ARC layer 1222, see FIG. 12, is deposited on oxidized $CH_3SiH_3$ layer 1220 and inside the holes such that the ARC material provides a non-conformal partial fill 1223 and 1225 in ARC lined holes 1224 and 1226 respectively. Subsequently, a conventional deep U.V. photoresist 1228 layer having a trench etch mask 1230 is prepared on the ARC lined structure. The trench etch starts with a conventional etch to remove portion 1232 of the ARC liner that is present on layer 1220 which is exposed by the trench etch mask. Etching liner portion 1253 also removes ARC material from the partial fills 1223 and 1225 that are deposited in holes 1224 and 1226. However, at the completion of etching liner portion 1232 (not shown), some ARC material remains in the bottom of holes 1224 and 1226 because the partial fill is a substantially thicker ARC layer than liner portion 1232. Subsequently, a trench (not shown) is etched through layer 1220 in a manner similar to forming trench 1140 shown in FIG. 11B. Trench etching using the novel etch technique is selective to organic ARC material, thus preventing etching of nitride layer 1210 and thus preventing the opening of the nitride layer at the bottom of the via hole.

Alternatively, etching of the nitride layer can be prevented or reduced by photoresist that is deposited in the holes prior to etching the trench employing the etch technique of the present invention.

Micro trenching was not observed at the bottom of any of the trenches that were etched through the oxidized organo silane layers of the embodiments of the present invention.

Embodiments of the present invention described in connection with FIGS. 7A through 12 include partially oxidized $CH_3SiH_3$ using $N_2O$ oxidizing gas in innert carrier gas, and including a carbon content of at least 1% by atomic weight. It is believed that the techniques as illustrated in connecting with FIGS. 7A through 12 can similarly be utilized when employing partially oxidized $(CH_3)_3SiH$ using $O_2$ gas in inert carrier gas. It is also believed that these techniques are applicable to dielectric materials that are formed by partially oxidizing organo silane compounds having the structure $SiH_a(CH_3)_b(C_2H_5)_c(C_6H_5)_d$, where a=1 to 3, b=0 to 3, c=0 to 3, d=0 to 3, and a+b+c+d=4, or the structure $Si_2H_e(CH_3)_f(C_2H_5)_g(C_6H_5)_h$, where e=1 to 5, f=0 to 5, g=0 to 5, h=0 to 5, and e+f+g+h=6, such that the resulting dielectric material includes a carbon content of at least 1% by atomic weight.

Figure 13A:
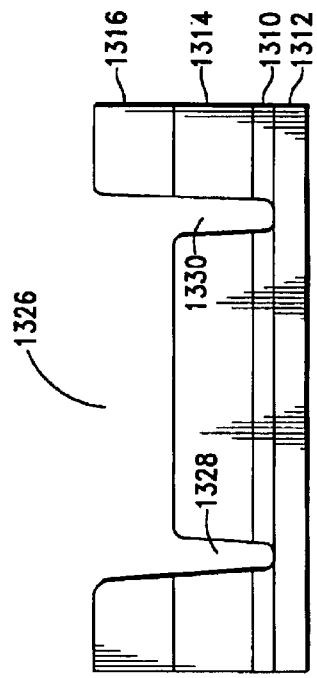
FIGS. 13A–13C are cross sectional views illustrating another embodiment of the present invention.
Figure 13B:
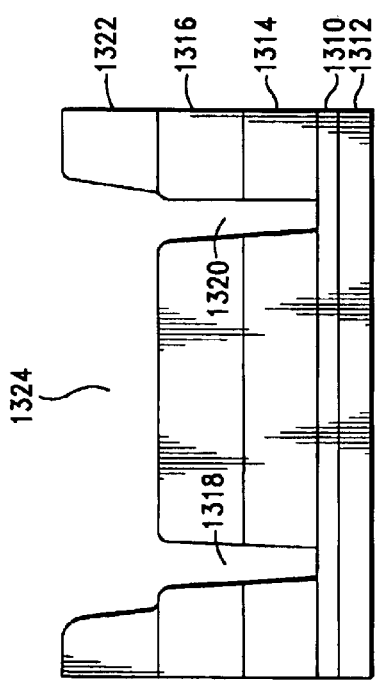
Figure 13C:
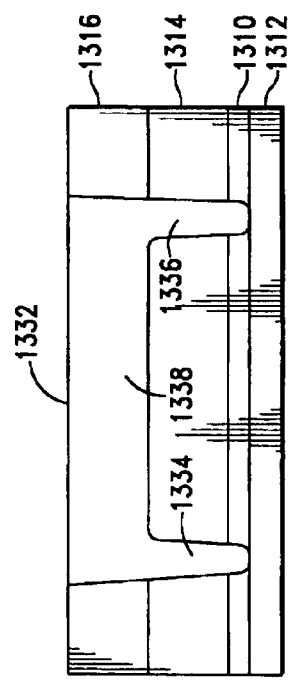

FIGS. 13A–13C illustrate another embodiment of the present invention for fabricating dual damascene IC structures. An etch stop layer such as silicon nitride 1310 is deposited on a semiconductor substrate 1312, as shown in FIG. 13A. this is followed by the deposition of an $SiO_2$ layer 1314, for example utilizing well known TEOS technology. Subsequently, a layer 1316 is deposited on $SiO_2$ layer 1314. Layer 1316 comprises partially oxidized $CH_3SiH_3$ including at least 1% of carbon by atomic weight, employing materials and techniques similar to those described in connection with layer 312 shown in FIG. 3A. Returning to FIG. 13A, holes 1318 and 1320 are anisotropically etched successively through layers 1316 and 1314, thereby forming holes that expose etch stop layer 1310, using conventional etch methods and techniques. A conventional deep U.V. photoresist layer 1322 is applied to the structure containing holes 1318 and 1320. A trench etch mask 1324, see FIG. 13A, is prepared in photoresist 1322, overlaying holes 1318 and 1320. As schematically depicted in FIG. 13B, a trench 1326 is formed by anistropically etching the trench pattern through the partially oxidized $CH_3SiH_3$ layer 1316, employing the novel etch parameters shown in Table D. This is followed by the removal of resist layer 1322, utilizing conventional techniques. Where etch stop layer 1310 comprises silicon nitride, the trench etch causes holes 1318 and 1320 to be etched through layer 1310, forming via holes 1328 and 1330, as described in connection with FIG. 11B. Etching through a silicon nitride layer such as layer 1310, can be prevented or significantly reduced by the techniques that are described in connection with FIG. 11B.

As shown in FIG. 13C, via holes 1328 and 1330 as well as trench 1326 are simultaneously filled with a conductive material 1332, such as a metal. The resulting dual damascene structure includes via plugs 1334 and 1336, and interconnect line 1338, Excess conductive material 1332 is removed from the surface of layer 1316 using conventional techniques that are well known to those of ordinary skill in the art. A liner (not shown) can be deposited inside trench 1326 and via holes 1328 and 1330 (FIG. 13B), employing materials and techniques similar to those described in connection with FIG. 11B.

It will be understood that it is necessary to clean or prepare the surface of a structure prior to the deposition of any layer in any subsequent fabrication step, using surface preparation methods and materials that are well known to those of ordinary skill in the art.

The novel etch procedure for C-doped silicon oxide such as partially oxidized organo silane materials containing at least 1% of carbon by atomic weight, has an etch selectivity to dielectric silicon oxide ranging from about 8 to about 10. The expression "silicon oxide" as defined herein, includes $SiO_2$, related non-stoichiometric materials $SiO_x$ and related dielectric silica glasses exhibiting similar chemistry as $SiO_2$. Related silica glasses include USG (undoped silica glass), FSG (fluorinated silica glass) and borophosphosilicate glass (BPSG). The expressions: "silicon oxide", "related non-stoichiometric materials $SiO_x$" and "related dielectric silica glasses", as defined herein, exclude C-doped silicon oxide.

It is believed that the high etch selectivity to silicon oxide which is obtained with the novel etch procedure, is due at least in part to the low ion energy to which the structure, such as a wafer, is exposed in embodiments of the novel etch procedure. This low ion energy is thought to be sufficient to provide a mainly chemical etch with relatively low sputter activity of the partially oxidized organo silane material. The low bias power results in a very low etch rate of silicon oxide, since silicon oxide generally requires sputter enhanced chemical etch in order to achieve a substantial etch rate. A suitable low ion energy can for example be obtained by using a low bias power, such as about 250 W to about 400 W when employing an inductively coupled plasma reactor employing a separately controlled plasma source power and plasma bias power. Alternatively, it is believed that a low source power, for example no greater than about 400 W, can be utilized in an RIE (reactive ion etch) or MERIE (magnetically enhanced RIE) etch reactor.

Embodiments of the present invention have been described wherein the etch chemistry employs Ar gas. It will be understood that the invention is equally operable when inert gases other than Ar are utilized.

Etch parameters of the present invention are exemplified in Table E.

TABLE E

| | |
|---|---|
| $CH_2F_2$ Flow (sccm) | 20–40 |
| Ar Flow (sccm) | 200–400 |
| Inner Source Power (W) | 150–250 |
| Outer Source Power (W) | 500–700 |
| Bias Power (W) | 250–400 |
| Pressure (mT) | 30–90 |

As illustrated in Table E, a pressure range of 30 to 90 mT provides a suitable pressure range, pressures ranging from 10 to 29 mT can also be utilized. However, pressures <30 mT typically result in reduced $SiO_2$ etch selectivity as compared with the noted pressure range.

Embodiments of the present invention include etching C-doped silicon oxide such as oxidized organo silane materials by means of an IPS etching chamber employing high density plasma etching, such as described in connection with FIG. 4. However, it is also contemplated to use conventional parallel RIE plate etch reactors such as described in U.S. Pat. 5,000,113 (Wang et al., 1991) as well as conventional MERIE etch reactors providing the etch parameters of these reactors include the parameters shown in Table F.

TABLE F

| | |
|---|---|
| Reactive Gas | $CH_2F_2$ |
| Carrier Gas | Inert Gas |
| Bias Energy (W) | no greater than about 400 |

The expression "bias energy" as defined herein includes (1) bias power that is applied to the structure, such as a wafer, in an inductively coupled dual coil plasma reactor and (2) power that is applied in a capacitively coupled plasma reactor that does not employ coils.

The exemplary flow rate of the inert gas shown in Table F ranges from about 5 times to about 20 times the flow rate of $CH_2F_2$. Suitable $CH_2F_2$ flow rates range from about 20 to about 40 sccm, while the inert gas flow ranges from about 200 to about 400 sccm. Suitable pressures for the etch parameters shown in Table F range from about 10 mT to about 90 mT.

The experimental results indicate that the preferred etch plasma ionization energy ranges from about $10^{10}/cm^3$ to about $10^{11}/cm^3$.

Figure 14:
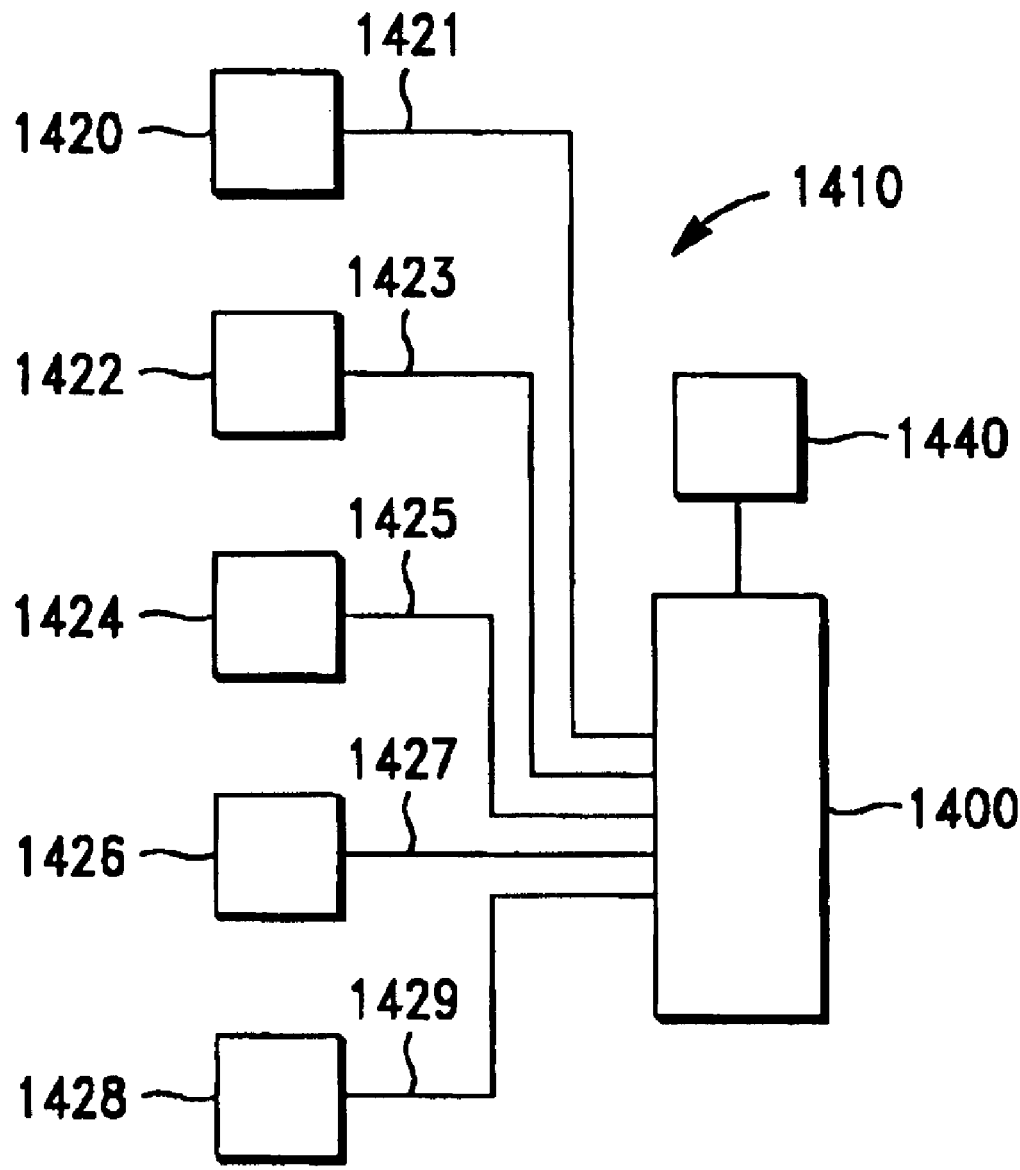
FIG. 14 is a block diagram illustrating a manufacturing system for fabricating IC structures of the present invention.

The fabrication techniques of the present invention require a sequence of processing steps. Each processing step can be performed at a fabrication station. All or some of the fabrication stations and their respective processing steps can be integrated by means of a novel apparatus including a controller 1400 illustrated in FIG. 14. Controller 1400 is adapted for controlling a number of fabrication stations that are utilized in the formation of fabricated structures, such as the IC structures described in connection with FIGS. 7A, 7B, 8 and 10A–10D. As illustrated in FIG. 14, a novel manufacturing system 1410 for fabricating IC structures includes controller 1400 and a plurality of fabrication stations: 1420, 1422, 1424, 1426 and 1428. Additionally, system 1410 has operative links 1421, 1423, 1425, 1427 and 1429 that provide connections between controller 1400 and fabrication stations 1420, 1422, 1444, 1426 and 1428 respectively. The novel apparatus includes a data structure such as a computer program that causes controller 1400 to control the processing steps at each of the fabrication stations and to, optionally, regulate the sequence in which fabrication stations are used in order to form the novel structures.

Examples of suitable controllers include conventional computers and computer systems including one or more computers which are operably connected to other computers or to a network of computers or data processing devices. Suitable computers include computers commonly known as personal computers. The data structure which is used by controller 1400 can be stored on a removable electronic data storage medium 1440 (FIG. 14) such as computer floppy disks, removable computer hard disks, magnetic tapes and optical disks, to facilitate the use of the same data structure at different manufacturing locations. Alternatively, the data structure can be stored on a non-removable electronic data storage medium, including a medium positioned at a location which is remote (not shown) from controller 1400, using such data devices as are well known to those of ordinary skill in the art. The data structure can be communicated from a remote location to controller 1400 using communicating techniques which are well known to those of ordinary skill in the art including hard wire connections, wireless connections and data communication methods utilizing one or more modems or techniques using one or more computers commonly known as servers. The data storage medium can be operably connected to the controller using methods and device components which are well known to those of ordinary skill in the art. Examples of suitable fabrication stations for manufacturing system 1410 include the stations shown in Table G.

TABLE G

| Station | Processing Step |
|---|---|
| 1420 | depositing a silicon oxide layer on a substrate |
| 1421 | depositing a layer of C-doped silicon oxide such as partially oxidized organo silane including at least 1% of carbon by atomic weight, on the silicon oxide layer |
| 1424 | depositing a photoresist layer on the layer of partially oxidized silane material |
| 1426 | forming an etch mask having an etch pattern in the photoresist layer |
| 1428 | anisotropically etching the etch pattern through the C-doped silicon oxide layer to expose the silicon oxide layer, including employing a plasma comprising (1) a gas mixture including $CH_2F_2$ and inert gas and (2) plasma conditions comprising (i) a bias power range of about 250 W to about 400 W and (ii) a pressure range of about 30 mT to about 90 mT. |

Additional fabrication stations can be added to manufacturing system 1410, for example one or more planarizing stations. Also, one or more stations can be added for fabricating an additional layer such as an ARC layer or an adhesive layer that is deposited on the silicon oxide layer prior to the deposition of the partially oxidized organo silane layer. The sequence of processing steps shown in Table G is illustrative of system 1410. However, the invention is equally operable in systems wherein a controller, such as controller 1400, causes the sequence to be altered, for example by repeating a previously executed processing step if test results indicate that this processing step should be partly or completely repeated. Alternatively, the process sequence which is controlled by a controller such as controller 1400, can include processing steps such as surface preparation which may be preformed following any of the fabrication stations shown in FIG. 14 and Table G. It is also contemplated that one or more fabrication stations can be positioned at a location that is remote from the other fabrication stations in which case an additional controller or a network of controllers can be employed to control the remotely located manufacturing station.

As illustrated in FIG. 14, controller 1400 is adapted to be connected to each of the manufacturing stations through operative links. Each of these links provides a bidirectional connection enabling controller 1400 to transfer commands from its data structure, such as specific operating parameters, and to receive information, such as test data, from the fabrication station. The operative links can be in the form of hard wire connections or wireless connections.

The invention has been described in terms of exemplary embodiments of the invention. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims.

We claim:

1. A method of plasma etching C-doped silicon oxide, the method comprising: etching the C-doped silicon oxide inside an etch reactor employing plasma conditions including (1) flowing $CH_2F_2$ gas and inert gas into the reactor and (2) a reactor bias energy no greater than about 400 W.

2. A method of plasma etching an etch pattern through a layer of C-doped silicon oxide, the method comprising:
   a) depositing a photoresist layer on the C-doped silicon oxide layer;
   b) forming an etch mask having the etch pattern in the photoresist layer;
   c) etching the pattern through the C-doped silicon oxide layer inside an etch reactor, wherein etching the pattern comprises employing plasma conditions including (1) $CH_2F_2$ gas flowing into the reactor at a first predetermined flow rate, (2) inert gas flowing into the reactor at a second predetermined flow rate and (3) a reactor bias energy no greater than about 400 W.

3. The method of claim 1 further comprising plasma conditions wherein the second flow rate ranges from about 5 times to about 20 times higher than the first flow rate.

4. The method of claim 1 wherein:
   a) the first flow rate ranges from about 20 sccm to about 40 sccm; and
   b) the second flow rate ranges from about 200 sccm to about 400 sccm.

5. The method of claim 1 wherein the plasma conditions additionally comprise a plasma ionization density ranging from about $10^{10}/cm^3$ to about $10^{11}/cm^3$.

6. The method of claim 1, wherein the etch reactor comprises an inductively coupled plasma reactor employing a separately controlled plasma source power and plasma bias power.

7. The method of claim 1 wherein the etch reactor is selected from the group consisting of reactors adapted for forming a plasma density ranging from about $10^{10}/cm^3$ to about $10^{11}/cm^3$, RIE reactors and MERIE reactors.

8. The method of claim 1 wherein the C-doped silicon oxides comprises an oxidized organo silane layer including an oxidized organo silane compound that is formed by reacting an organo silane compound with an oxidizing compound.

9. The method of claim 8 wherein the oxidized organo silane layer comprises a carbon content of at least 1% by atomic weight.

10. The method of claim 9 wherein the organo silane compound is selected from the group consisting of methylsilane, dimethylsilane, trimethylsilane, tetramethylsilane; imethylsilanediol, diphenylsilane, diphenylsilanediol, methylphenylsilane, bis(methylsilano)methane, 1,2-bis (methylsilano)ethane, 1,3,5-trisilano-2,4,6-trimethylene, dimethyldimethoxysilane, diethyldiethoxysilane, dimethyldiethoxysilane, diethyldimethoxysilane, hexamethyldisiloxane, octamethylcyclotetrasiloxane, and fluorinated derivatives thereof.

11. The method of claim 10 wherein the organo silane compound is reacted with $N_2O$ gas at plasma conditions sufficient to form the layer and wherein the plasma conditions additionally comprise:
   a) a high frequency RF power density ranging from about 0.16 $W/cm^2$ to about 0.48 $W/cm^2$; and
   b) a sufficient amount of organo silane compound with respect to the $N^2O$ gas to provide a layer of material with a carbon content of at least 1% by atomic weight.

12. The method of claim 10 wherein the organo silane is reacted with $O_2$ gas at plasma conditions sufficient to form the layer and wherein the plasma conditions comprise:
   a) a high frequency RF power density greater than about 0.03 $W/cm^2$; and
   b) a sufficient amount of organo silane compound with respect to the $O_2$ gas to provide a layer of material with a carbon content of at least 1% by atomic weight.

13. The method of claim 8 wherein the oxidizing compound selected from the group consisting of $N_2O$, $O_2$ and $H_2O_2$.

14. The method of claim 1 wherein the etch pattern is provided in an organic photoresist and wherein the method of etching comprises an etch selectivity of about 5 to the organic photoresist.

15. A method of anisotropically plasma etching an etch pattern through a layer of C-doped silicon oxide of a first structure that is fabricated by depositing the C-doped silicon oxide layer on a layer of silicon oxide, the method comprising:
   a) depositing a photoresist layer on the C-doped silicon oxide layer of the first structure;
   b) forming an etch mask having the etch pattern in the photoresist layer;
   c) positioning the first structure having the etch mask inside an etch reactor;
   d) exposing the C-doped silicon oxide layer to a plasma including : (1) $CH_2F_2$ gas flowing into the reactor at a first predetermined flow rate, (2) inert gas flowing into the reactor at a second predetermined flow rate and (3) a reactor bias energy no greater than about 400 W; and
   e) continuing exposing to the plasma until the pattern has been etched through the C-doped silicon oxide layer wherein a second structure is formed having a cavity in the C-doped silicon oxide layer such that the cavity exposes the silicon oxide layer as defined by the etch pattern.

16. The method of claim 15 wherein the method of etching comprises an etch selectivity to silicon oxide ranging from about 8 to about 10.

17. The method of claim 15 comprising an etch front having an etch front flatness no greater than about 0.1.

18. The method of claim 15 wherein the C-doped silicon oxide layer comprises a layer thickness of at least about 300 nm.

19. The method of claim 18 wherein a substantially flat etch front is formed on the silicon oxide layer.

20. The method of claim 15 wherein the C-doped silicon oxide layer comprises an oxidized organo silane compound that is formed by oxidizing an organo silane compound selected from the group consisting of methylsilane, dimethylsilane, trimethylsilane, tetramethylsilane;dimethylsilanediol, diphenylsilane, diphenylsilanediol, methyiphenylsilane, bis(methylsilano)methane, 1,2-bis(methylsilano)ethane, 1,3,5-trisilano-2,4,6-trimethylene, dimethyldimethoxysilane, diethyldiethoxysilane, dimethyldiethoxysilane, diethyldimethoxysilane, hexamethyldisiloxane, octamethylcyclotetrasiloxane, and fluorinated derivatives thereof, such that the oxidized compound comprises a carbon content of at least 1% by atomic weight.

21. The method of claim 15 wherein the silicon oxide layer is selected from the group consisting of $SiO_2$, related non-stoichiometric materials SiOx and related dielectric silica glasses exhibiting similar chemistry as $SiO_2$.

22. The method of claim 15 wherein the reactor is selected from the group consisting of reactors adapted for forming a plasma density ranging from about $10^{10}/cm^3$ to about $10^{11}/cm^3$, RIE reactors and MERIE reactors.

23. A method of plasma etching a trench and a via in a first structure having a substrate upon which are sequentially formed a silicon oxide layer and a C-doped silicon oxide layer, the method comprising:
  a) depositing a first photoresist layer on the C-doped silicon oxide layer;
  b) forming a first etch mask having an via pattern in the first photoresist layer;
  c) anisotropically etching the via pattern through the C-doped silicon oxide layer and the silicon oxide layer, forming a cavity that exposes the substrate;
  d) removing the first photoresist, wherein a second structure is formed;
  e) forming a second photoresist layer on the second structure, wherein the second photoresist layer includes a second etch mask having a trench pattern that overlays the cavity;
  f) anisotropically etching the trench pattern through the C-doped silicon oxide layer forming a trench exposing the underlying via and the underlying silicon oxide layer, wherein etching the trench pattern comprises etching with a plasma including: (1) $CH_2F_2$ gas flowing at a first predetermined flow rate, (2) inert gas flowing at a second predetermined flow rate and (3) plasma conditions comprising (i) a bias energy no greater than about 400 W; and
  g) removing the second photoresist, wherein a third structure is formed that is adapted for forming a dual damascene structure therein.

24. The method of claim 23 wherein the C-doped silicon oxide comprises a layer thickness of at least about 300 nm, thereby forming a fourth structure.

25. The method of claim 23 comprising a trench etch front having an etch front flatness no greater than about 0.1.

26. A method of forming a structure on a substrate, the method comprising:
  a) depositing a silicon nitride layer on the substrate;
  b) depositing a first adhesive layer on the silicon nitride layer;
  c) depositing a silicon oxide layer on the first adhesive layer;
  d) depositing a second adhesive layer on the silicon oxide layer;
  e) depositing a layer of C-doped silicon oxide on the second adhesive layer;
  f) depositing a first photoresist layer on the C-doped silicon oxide layer;
  g) developing a via etch pattern in the photoresist layer;
  h) anisotropically etching the via etch pattern such that a hole is formed that exposes the silicon nitride layer;
  i) removing the first photoresist;
  j) depositing a second photoresist layer on the material layer;
  k) developing a trench pattern in the second photoresist layer such that the trench pattern overlays the hole;
  l) anisotropically etching the trench pattern through the C-doped silicon oxide layer and the second adhesive layer, comprising employing a plasma including (1) a gas mixture comprising $CH_2F_2$ and inert gas and (2) plasma conditions including
    (i) a bias energy range of about 250 to about 500 W and
    (ii) a pressure range of about 10 mT to about 90 mT, wherein a trench is formed overlaying a via and the silicon oxide layer.

27. The method of claim 26 wherein etching the trench pattern additionally comprises forming a trench having a substantially flat etch front.

28. A structure formed according to the method of claim 26.

* * * * *